(12) United States Patent
Hosier et al.

(10) Patent No.: US 6,396,297 B1
(45) Date of Patent: May 28, 2002

(54) ELECTRICAL DETECTION OF V-GROOVE WIDTH

(75) Inventors: Paul A. Hosier, Rochester; Paul W. Browne, Canandaigua; Scott L. TeWinkle, Ontario, all of NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/736,803

(22) Filed: Dec. 14, 2000

(51) Int. Cl.[7] .................... G01R 31/26; H01L 21/00
(52) U.S. Cl. ............... 324/765; 438/8; 438/16; 438/17; 438/18; 438/24; 437/227
(58) Field of Search ................. 324/765; 438/17, 438/16, 18, 8, 33, 24; 437/226, 227; 250/208.1

(56) References Cited

U.S. PATENT DOCUMENTS

| | | | |
|---|---|---|---|
| 4,814,296 A | | 3/1989 | Jedlicka et al. ............ 437/226 |
| 5,036,337 A | * | 7/1991 | Rezanka ..................... 347/14 |
| 5,219,796 A | | 6/1993 | Quinn et al. ................ 437/227 |
| 5,521,125 A | | 5/1996 | Ormond et al. ............. 437/227 |
| 5,526,454 A | * | 6/1996 | Mayer ........................ 385/49 |
| 5,629,244 A | * | 5/1997 | Matsuzaki ................... 438/52 |
| 5,691,760 A | | 11/1997 | Hosier et al. ............... 347/238 |
| 5,910,679 A | * | 6/1999 | Kim ........................... 257/622 |
| 6,335,559 B1 | * | 1/2000 | Charles ...................... 257/620 |
| 6,066,883 A | | 5/2000 | Hosier et al. ............... 257/452 |
| 6,252,220 B1 | * | 6/2000 | Jedlicka et al. ............ 250/208.1 |
| 6,090,635 A | * | 7/2000 | Rothman et al. ............ 438/24 |
| 6,316,284 B1 | * | 9/2000 | Perregaux et al. .......... 438/70 |

* cited by examiner

Primary Examiner—N. Le
Assistant Examiner—Wasseem H. Hamdan
(74) Attorney, Agent, or Firm—P. Daebeler (57) ABSTRACT

An apparatus detects the width of a V-groove formed on a semiconductor wafer. A resistor overlaps a chip area and an area upon which the V-groove is to be etched on the wafer. A pad etched on the silicon wafer is coupled to the resistor. A tester supplies voltage to the pad after the V-groove has been etched into the silicon wafer; and a circuit coupled to the pad determines the width of the etched V-groove.

4 Claims, 9 Drawing Sheets

ELECTRICAL DETECTION OF V-GROOVE WIDTH

FIELD OF THE INVENTION

The present invention generally relates to electrical detection of V-groove width during the fabrication of photosensitive chips, which create electrical signals from an original image, as would be found, for example, in a digital scanner or facsimile machine.

BACKGROUND OF THE INVENTION

In the context of document processing, a raster input scanner, or simply "scanner," is a device by which an image on a hardcopy original, such as a sheet of paper, is converted to digital data. A common design for a scanner includes a linear array of photosites with corresponding circuitry to form a linear array of photosensors. Each photosensor in the array is adapted to output a signal, typically in the form of an electrical charge or voltage, of a magnitude proportional to or otherwise related to the intensity of light incident on the photosensor. By providing a linear array of these photosensors and causing the array to scan relative to the hard-copy original, each photosensor will output a sequence of charge signals resulting from the various gradations of dark and light in the image as the individual photosensors move through a path relative to an image.

In most low cost scanners, such as presently found in inexpensive facsimile machines, the most typical technology for creating such a scanner is the charge-coupled device, or CCD. For higher-quality applications, CMOS technology in one or more photosensor chips are used.

The number of photosites (and therefore photosensors) that can be packed onto a single chip or wafer is limited, and this, in turn, limits the image resolution that can be achieved with a single photosensitive array. Joining several of the smaller photosensor arrays together to form a longer array, and particularly, to form a full page width array with increased resolution along with the attendant simplification of the scanning system that this allows is desirable.

Arrays of photosites are typically formed from a plurality of generally rectangular substrates and these substrates are separated by dicing or other suitable means from one or more circular silicon wafers to form photosensitive chips. (The shape of substrates do not have to be rectangular. Other geometric shapes are also possible). The photosensitive chips are preferably assembled end to end in a collinear fashion to improve image quality and to form a full width array.

One method presently employed to produce photosensitive chips is the formation of aligned V-grooves in the semiconductor wafer. The V-grooves are preferably etched along the 111 plane of the silicon, which is the easy slip plane for stress relief or cracks. V-grooves are needed for proper dicing of the chips in regions very close to active circuits. If the proper V-groove width is not there for each chip during dicing, chipping damage may occur and this will cause yield problems or a reliability degradation problem in the final photosensor array. Only 100% visual inspection of all wafers catches all of these defects, or a 100% visual inspection of a sample of wafers might indicate that there is a problem. Visual inspection of every chip on every wafer is labor intensive and prone to human error. Therefore, there is a need for a new method and apparatus to inspect and evaluate V-groove widths on the semiconductor wafer.

SUMMARY OF THE INVENTION

The present invention provides an apparatus for detecting width of a V-groove on a semiconductor wafer including a V-groove width monitor resistor overlapping a chip area and an area upon which the V-groove is to be etched; an pad etched on the silicon wafer and coupled to the V-groove width monitor resistor; and a tester supplying voltage to the pad after the V-groove has been etched into the silicon wafer; and apparatus to determine the width of the etched V-groove. The pad can be an input/output pad. The pad can be a separate test pad for testing V-groove width only. A pull up resistance may be connected to the pad and V-groove width monitor resistor.

DESCRIPTION OF THE PREFERRED EMBODIMENTS

While the present invention will hereinafter be described in connection with a preferred embodiment thereof, it will be understood that it is not intended to limit the invention to that embodiment. On the contrary, it is intended to encompass all alternatives, modifications and equivalents as may be included within the spirit and scope of the invention as defined in the appended claims.

Figure 1:
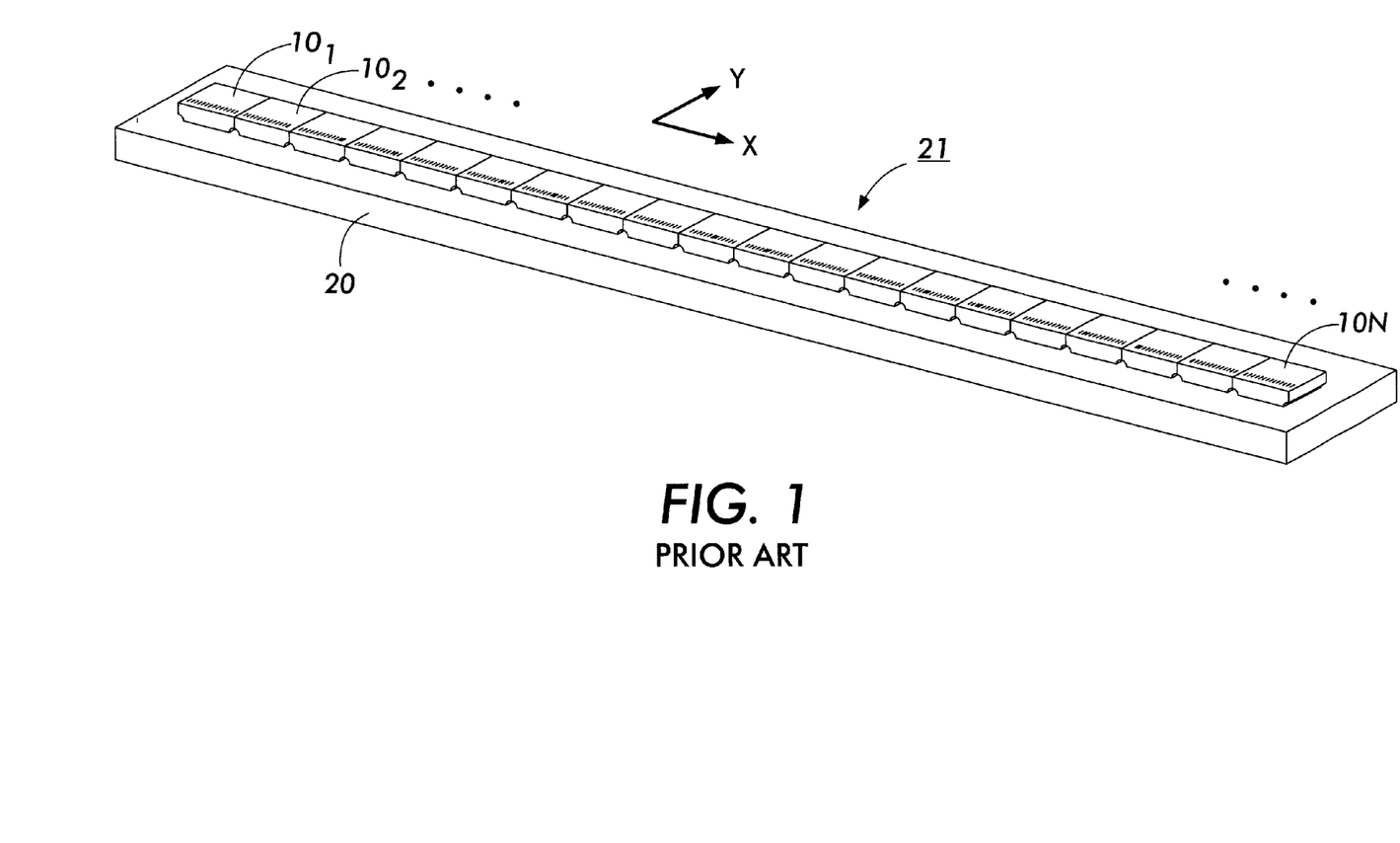
FIG. 1 is a simplified perspective view showing a base substrate having a plurality of semiconductor chips assembled and mounted end to end on the base substrate.

FIG. 1 shows a full width array image sensor 21 including a plurality of photosensitive chips 10 mounted end-to-end on a substrate 20 to form an effective collinear array of photosites, which extends across a page image being scanned for a scanner, copier, facsimile machine or other document reading device. Generally, each individual photosite is adapted to output a charge or voltage signal indicative of the intensity of light of a certain type impinging thereon. Various structures, such as transfer circuits, or charged coupled devices, are known in the art for processing signal output by the various photosites.

Figure 2:
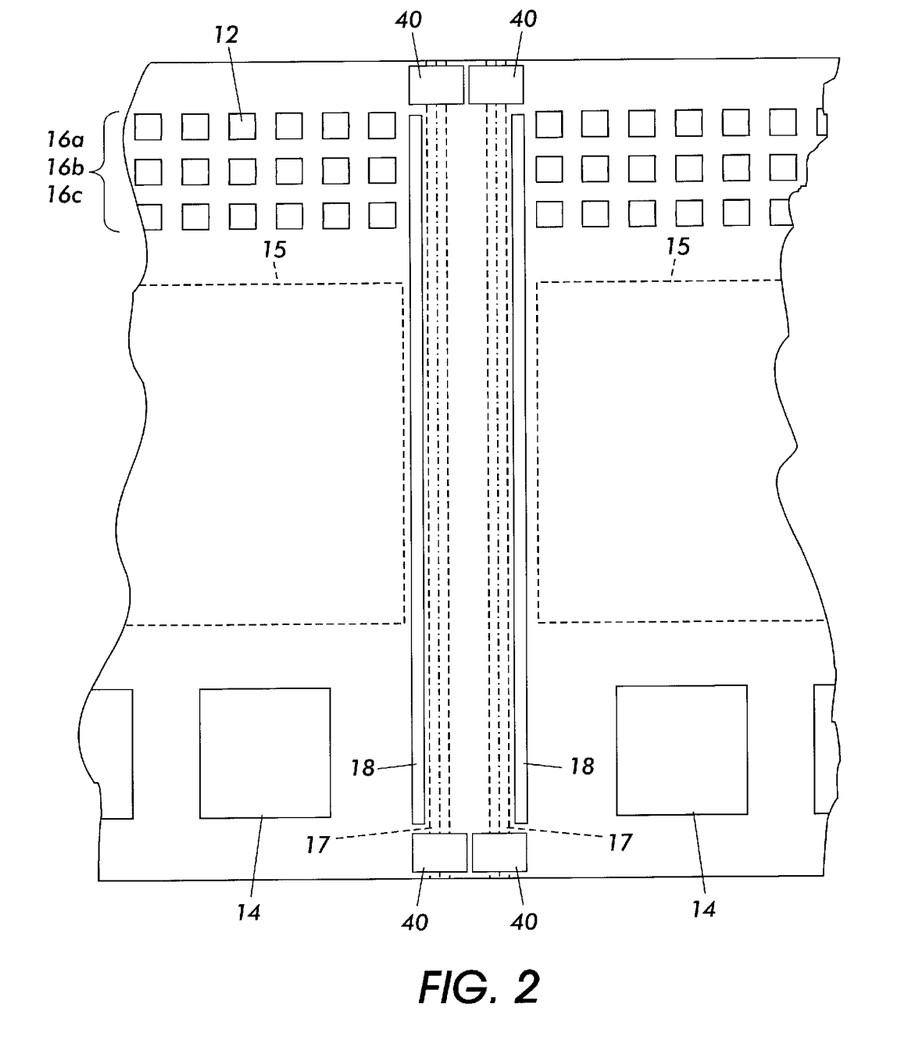
FIG. 2 is a detailed partial plan view of two representative semiconductor chips on a semiconductor wafer relevant to the present invention before dicing.

FIG. 2 is a plan view showing part of two of these photosensitive chips 10 relevant to the claimed invention. The photosensitive chip 10 is generally made of a semiconductor substrate, as is known in the art, in which circuitry and other elements are formed, such as by photolithographic etching. A few of the most relevant structures are one or more linear arrays of photosites 12, each of which forms the photosensitive surface of circuitry within the photosensitive chip 10, and a set of bonding pads 14. The photosites 12 are typically arranged in a linear array along one main dimension of the photosensitive chip 10, with each photosite 12 along the array corresponding to one pixel in an image signal. The photosites 12 are preferably for sensing the three primary colors, blue, green and red. However, the photosites 12 sensing blue, green and red could be replaced with photosites sensing yellow, magenta and cyan, for example. Any other suitable combination of color sensitive photosites may also be used. Each photosite is associated with a corresponding photosensor. Preferably, there are three parallel linear arrays 16a, 16b, and 16c for the three primary colors. However, any number of multiple parallel linear arrays may be provided on each photosensitive chip 10.

The bonding pads 14 are distinct surfaces on the main surface of the photosensitive chip 10, and are intended to accept wire bonds attached thereto. The bonding pads 14 thus serve as the electronic interface between the photosensitive chip 10 and any external circuitry. The active circuitry for obtaining signals related to light directed to the photosites 12, and for unloading image data from the photosensitive chip 10 is generally indicated as 15. The active circuitry 15 is generally deposited between a linear array of photosites 12 and a linear array of bonding pads 14.

Photosensitive chips 10 are typically formed in batches on semiconductor wafers 11, which are subsequently cleaved, or "diced," to create individual photosensitive chips. Typically, the semiconductor wafers are made of silicon. Photolithographically etched V-grooves 17 define precisely the intended boundaries of a particular photosensitive chip 10 for dicing as shown in the partial perspective view of two adjacent photosensitive chips 10 in FIG. 2. (Alternatively, U-grooves or trenches may be used to define the intended boundaries in the same location as V-grooves 17.) Thus, all of the photosites 12, bonding pads 14 and circuitry 15 for relatively large number of photosensitive chips 10 are etched onto a single semiconductor wafer. The region between the V-grooves 17 is called the tab region, or vertical scribe line (industry term is scribe line). A region in which a V-groove is to be etched is called a V-groove region. A guardring 18 parallel to the V-grooves 17 is formed on each chip as taught for example in U.S. Pat. No. 6,066,883. Reference numeral 40 denotes the area on the semiconductor wafer 11, where the circuit for the electrical detection of V-groove width is formed.

Figure 3:
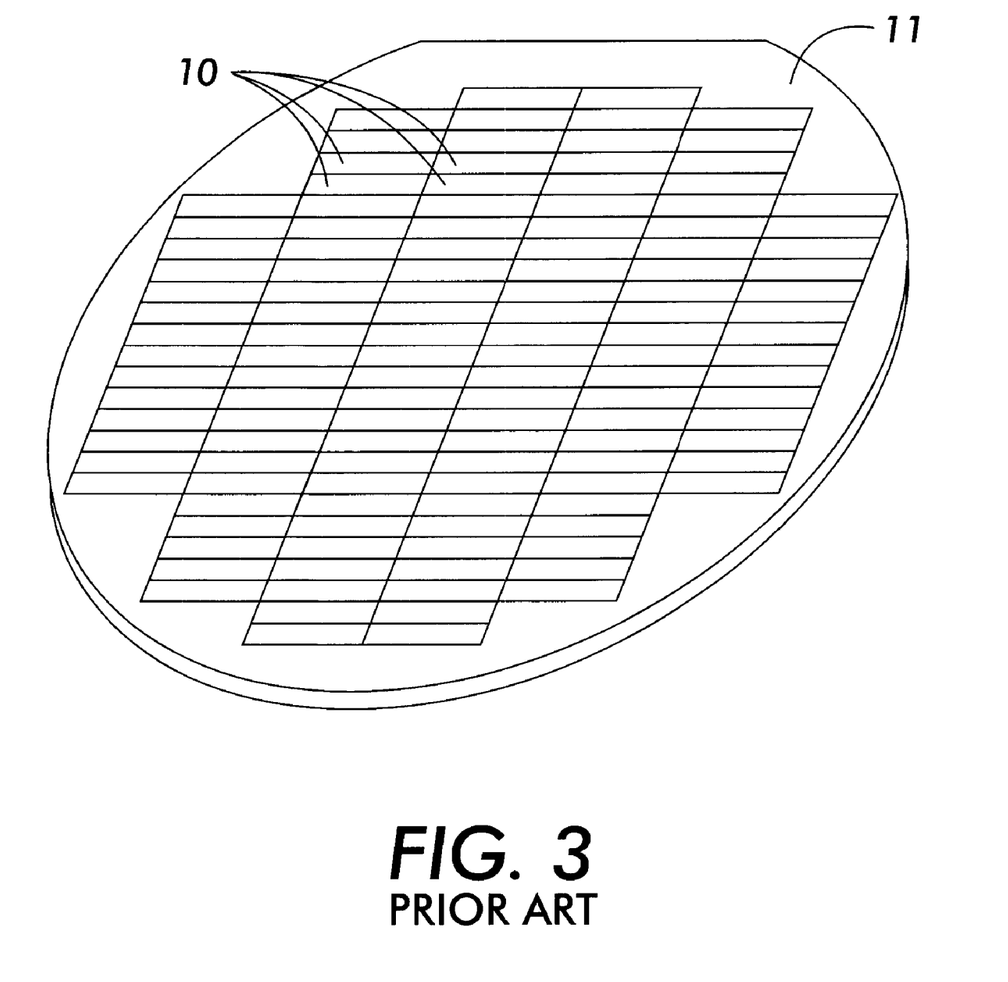
FIG. 3 is a simplified perspective view of a semiconductor wafer.

FIG. 3 shows a typical semiconductor wafer 11, in isolation, wherein a relatively large number of photosensitive chips 10 are created in the wafer 11 prior to dicing thereof. Each photosensitive chip 10 has a distinct photosensitive chip area within the main surface of the wafer 11. The phrase "chip area" refers to a defined area within the main surface of the wafer 11 which is intended to comprise a discrete photosensitive chip 10 after the dicing step, when individual photosensitive chips 10 are separated from the rest of the wafer 11.

As discussed above, the width of the V-groove must be known and controlled, such that it is wide enough for optimum dicing and also narrow enough that it does not interfere with circuitry near the edge of the chips 10. This invention allows the nondestructive measurement of the width of every V-groove 17 on every chip. (It is preferable but not necessary to measure every V-groove 17 on every chip on the silicon wafer 11). Generally, an implanted or diffused region overlaps V-groove 17, with electrical connections on both ends of the diffusion. Depending on its width, the V-groove 17 will cut away some, or all, of the diffused region changing the resistance of the electrical path between nodes. One end of the electrical path can be tied to an existing bonding pad 14 on the chip 10 and the other end to ground, if the decreased input resistance can be tolerated. Alternatively, a new test pad can be added just for the purpose of ascertaining the width of the V-groove. Further, a more complex circuit can be used to generate a pass/fail condition that can be used to alter an existing DC test measurement. Alternately, other complex DC test schemes can be used on existing bonding pads 14. Thus, using existing, or slightly modified circuit elements, DC tests can be used to check the V-groove widths 17, with or without the addition of any test pads.

Figure 4:
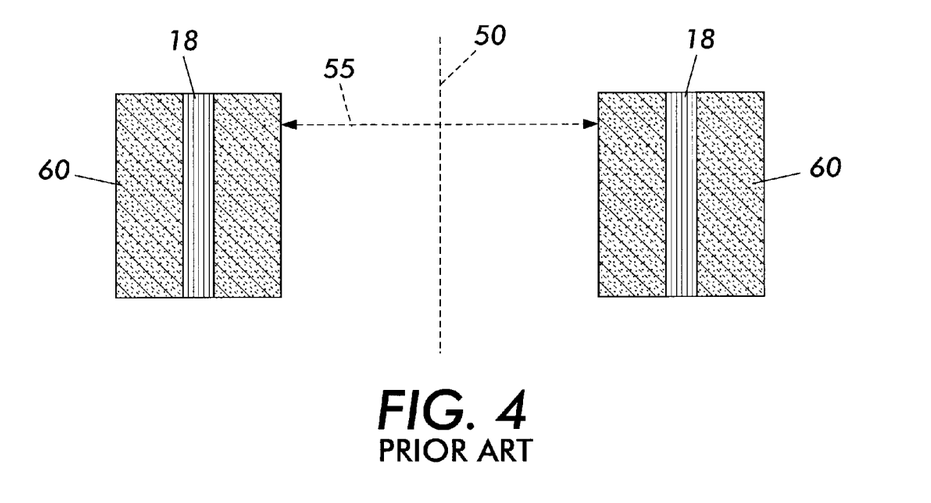
FIG. 4 is a plan view of a prior art V-groove structure on a silicon wafer.

FIG. 4 shows a partial plan view of a prior art V-groove structure on a silicon wafer in area 40. The center of the V-groove (V-groove center) is denoted by reference numeral 50. The width of the V-groove (V-groove width) is denoted by reference numeral 55. The guardrings, which are preferably n-doped silicon, are denoted by reference numeral 18. The silicon substrate is denoted by reference numeral 60. In the prior art, there is no circuit to detect the V-groove width 55 in area 40 as shown in FIG. 4.

Figure 5:
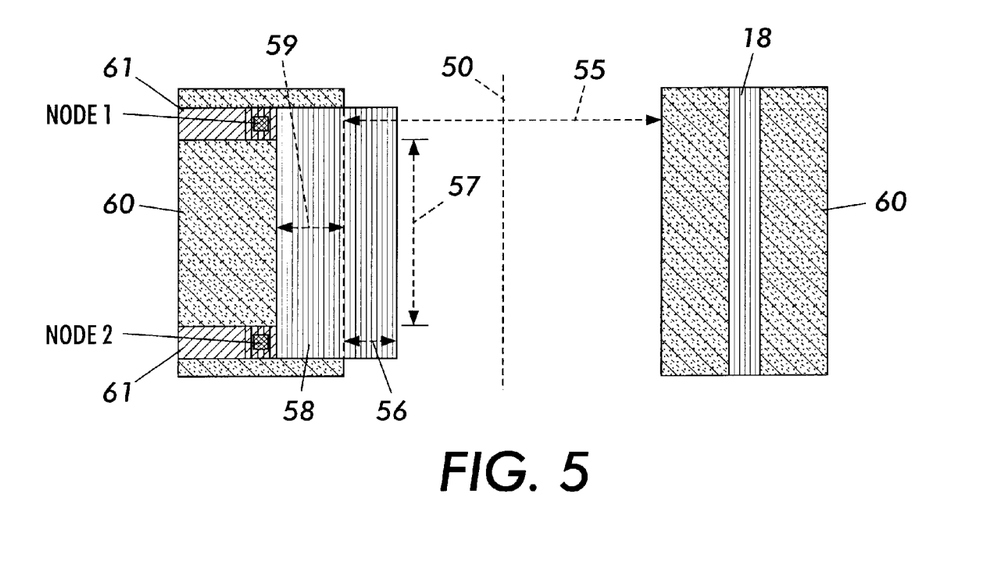
FIG. 5 is a plan view of a V-groove structure on a silicon wafer in accordance with a first embodiment of the present invention.
Figure 6:
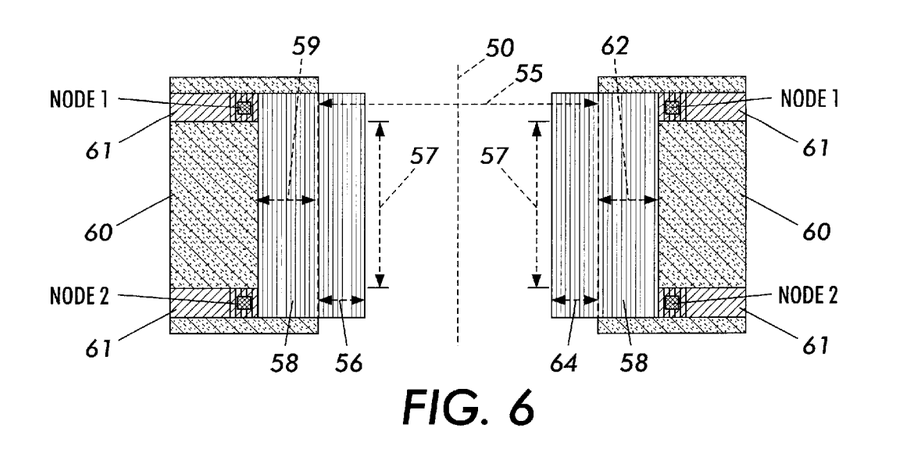
FIG. 6 is a plan view of a V-groove structure on a silicon wafer in accordance with a second embodiment of the present invention.
Figure 7:
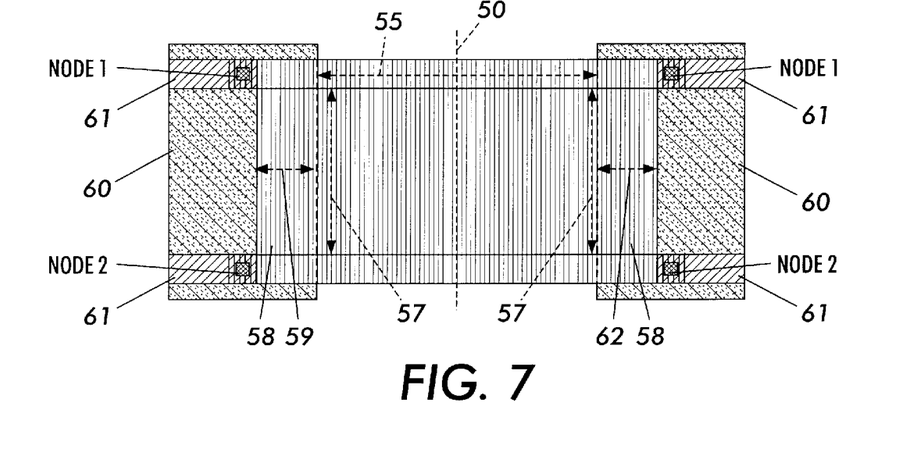
FIG. 7 is a plan view of a V-groove structure on a silicon wafer in accordance with a third embodiment of the present invention.

FIGS. 5–7 show the first three embodiments of circuits used to electrically detect the width of the V-groove 17. These embodiments are preferably located in area 40 in FIG. 2. (Please note that area 40 is not drawn to scale.) The nodes in the circuits are electrically connected through metal connectors 61. In all of the embodiments, the width of the V-grooves 17 etched on the silicon wafer 11 must be determined to ensure that the V-groove width 55 is within a specific range of V-groove widths. If the V-groove width 55 is too large, then the V-groove 17 will break the guardring 18, which effects end photosite performance. If the V-groove width 55 is even larger, the large width will encroach upon circuitry and cause a functional failure of the chip 10. However, if the V-groove width 55 is too small, then the saw for dicing the silicon wafer 11 may dice outside the V-groove 17 because the V-groove 17 does not fall within the saw tolerances. This causes cracks in the silicon causing failure of the chips 10.

In the first embodiment shown in FIG. 5, a V-groove width monitor resistor 58 is placed in parallel with and overlapping the area upon which V-groove 17 is to be etched on the silicon wafer 11. The resistor 58 preferably comprises a diffusion layer on the silicon 60, which overlaps both the minimum and maximum edges of the V-groove 17 to be etched on the silicon wafer 11. The width of the diffusion layer (resistor 58) prior to etching the V-groove 17 is equal to the sum of the overlap width 56 and the resistor width 59 after the V-groove 17 is etched into the semiconductor wafer 11 (resistor width 59). The overlap of the resistor 58 in the width direction (overlap width 56) are such, that for any expected variation in the V-groove width 55, the resistor width 59 is determined by the edge of the etched V-groove 17. Further, the length of the resistor 58 is determined by the distance between node 1 and node 2 as 15 denoted by reference numeral 57 in FIG. 5. The resistance of the resistor 58 is $(L/W)(\rho_0)$, where $\rho_0$ is resistor sheet rho in ohms/square, and L and W are the dimensions (length and width) of the resistor 58. Since W of the resistor is directly proportional to the negative of V-groove width 55, the resistance will be a linear indicator of the V-groove width 55.

Figure 8:
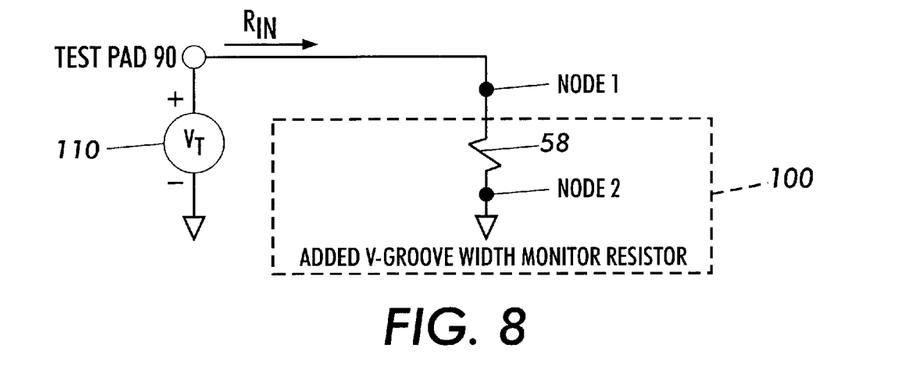
FIG. 8 is an electrical schematic in accordance with the first through third embodiments of the present invention.
Figure 9:
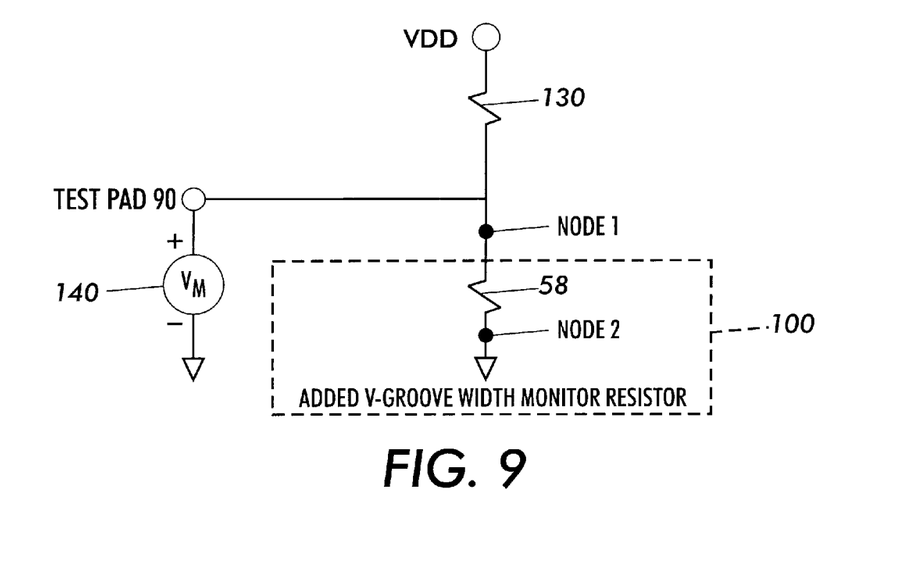
FIG. 9 is an electrical schematic in accordance with the first through third embodiments of the present invention.
Figure 10:
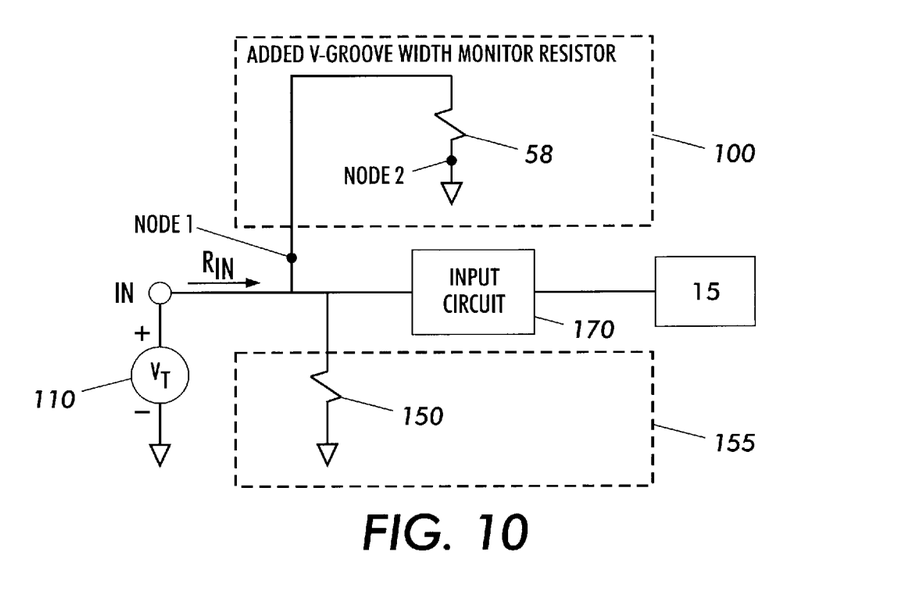
FIG. 10 is an electrical schematic in accordance with the first through third embodiments of the present invention.

Also, in the first embodiment, the guardring 18 may extend into area 40 as shown or may be eliminated from area 40. A metal layer 61 connected to resistor 58 through node 1 and node 2 provides an electrical connection between the contacts of resistor 58 and a test pad, ground, or other circuitry as shown in FIGS. 8–10. By measuring the resistance after the V-groove 17 has been etched, the resistor width 59 is ascertained using the above formula as will be discussed further with reference to FIGS. 8–10. Subsequently, the resistor width 59 is compared to the range of resistor widths acceptable for dicing. If the resistor width 59 is within the range (tolerance), then the chips 10 adjacent to the V-groove 17 should not fail or have reduced performance after dicing.

The second embodiment of the present invention as shown in FIG. 6 not only detects whether a resistor width 59 is within a certain tolerance for dicing (dicing tolerance) but the second embodiment detects also an alignment variation between the resistor mask (in this case N+, or active area) and the V-groove mask. This alignment variation will cause the resistor width to vary with a component that is independent of the V-groove width 55. The second embodiment of the present invention eliminates this undesirable random variation. This embodiment has a two resistors 58 which can be tied together in parallel, with a resulting resistance of $L/(W1+W2)(\rho_0)$, to form one V-groove width monitor resistor. Reference numeral 62 denotes width W2 and reference numeral 64 denotes a width overlapping the V-groove 17. (Please note that the two resistors 58 may have different widths and different resistances. However, they result in one resistance for the purposes of the present invention.) No matter what the alignment of the V-groove to resistor mask, the resultant sum of W1+W2 (denoted by reference numerals 59 and 62) will be a linear indicator of the V-groove width, which is compared to the range of resistor widths acceptable for dicing.

There is still a small independent component of variation of W1+W2 due to the image variation of the resistor mask. However, in practice, this variation is much smaller than the V-groove variation and therefore is tolerable. In addition, the V-groove width monitor resistor can be used in a circuit with a similar resistor to null out most of this effect, as shown in FIG. 9. If resistor 130 in FIG. 9 is similar to resistors 58, the voltage division between resistor 130 and resistor 58 will be largely independent of image variation. Specifically, resistor 130 should be made with the same N+ resistor mask, the same L and a W=W1+W2, for W1 and W2 corresponding to a nominal size V-groove. If W1+W2 is made to nominally be four times the expected V-groove variation, the small image error will be reduced by a factor of four times.

FIG. 7 shows the third embodiment of the present invention. Electrically, this configuration is exactly the same as the second embodiment when a V-groove 17 is present. However, if a V-groove 17 is malformed or missing, the resistance in FIG. 7 will register a very low resistance since the width will now be $W1+W2+W_{V-groove}$. This lower resistance can be used to flag a missing V-groove 17. In addition, another advantage of the FIG. 7 configuration is a continuous resistor active region across the V-groove 17, which assists ensuring uniform V-groove processing.

FIGS. 8–10 show electrical schematics for testing resistance after the V-groove 17 has been etched onto the silicon wafer 11 for the first three embodiments of the present invention. In FIG. 8, Node 1 connects the test circuit to the added V-groove width monitor resistor 58, which is connected to a reference voltage or ground by node 2 as denoted by reference numeral 100. By adding a test pad 90 (input/output pad) to the silicon wafer 11, the current through the resistor can be measured by applying a known test voltage (tester 110), and using an ammeter in series with the test voltage source. Alternatively, a current source could be applied to the resistor and the voltage across it could be measured by a voltmeter. Since the current and voltage are known, the resistance can be calculated. Based on the resistance value and length of the resistor, the width of the resistor can be ascertained. Therefore, the V-groove width can be determined.

In FIG. 9, Node 1 connects the test circuit to the added V-groove width monitor resistor 58, which is connected to a reference voltage or ground by node 2 as denoted by reference numeral 100. By adding a test pad 90 (input/output pad) and pull up resistor 130 to the silicon wafer 11, the voltage (measured by voltmeter 140) across the resistor 58 can be measured by applying a known voltage VDD (e.g. 5 volts) and measuring the voltage across the resistor 58 using a voltmeter 140 or other voltage measuring device. The resistor 58 can just be tied to the chip power supply or a test pad. Since the VDD voltage, pull up resistance and the divider voltage, $V_M$ are known, the resistance value of resistor 58 can be calculated. Since voltage division results in $V_M=R58/(R58+R130)$, then $R58=V_M \times R130/(1-V_M/VDD)$. R58 is the resistance of resistor 58, and R130 is the resistance of resistor 130. $V_M$ is the voltage measured by the voltmeter 140. Based on the resistance value and length of the resistor, the width of the resistor can be ascertained. Therefore, the V-groove width can be determined.

In FIG. 10, Node 1 connects the test circuit to the added V-groove width monitor resistor 58, which is connected to a reference voltage or ground by node 2 as denoted by reference numeral 100. The advantage of this embodiment is that an additional test pad (input/output pad) does not need to be added to the chip 10 on the silicon wafer 11. Instead, one of the existing bonding pads 14 may be used. Since the test voltage, $V_T$ applied by tester 110 which also measures input current $I_{IN}$ (with ammeter) and the resistance of resistor 150 are known, the resistance value of resistor 58 can be calculated. Based on the resistance value and length of the resistor, the width of the resistor can be ascertained. Therefore, the V-groove width can be determined. Please note that input circuit 170 acts as a buffer between the active circuitry 15 on chip 10 and test circuit 155, tester 110, and added V-groove width monitor resistor circuit 100.

Figure 11:
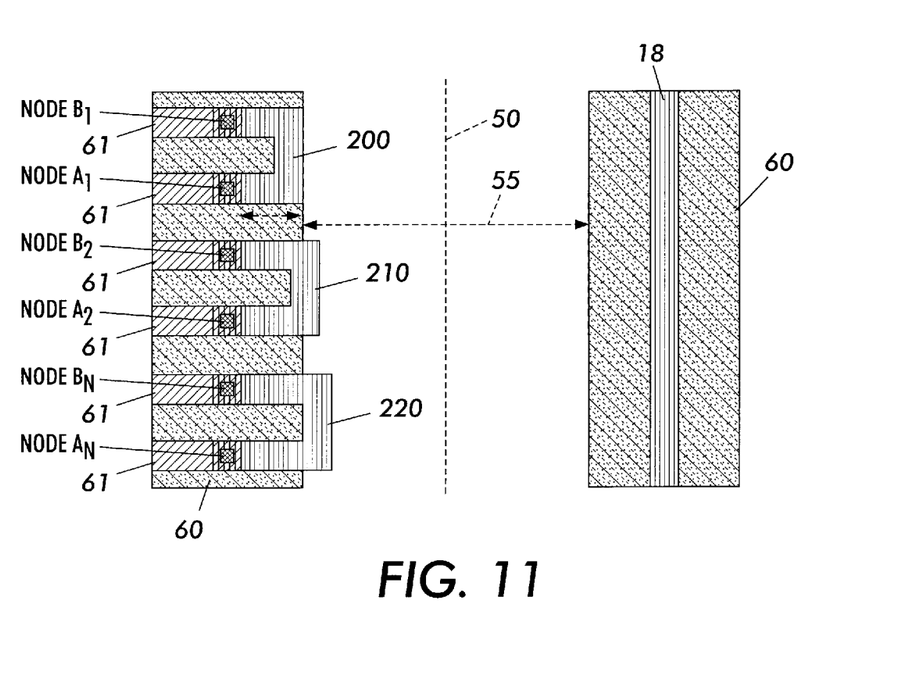
FIG. 11 is a plan view of a V-groove structure on a silicon wafer in accordance with a fourth embodiment of the present invention.
Figure 12:
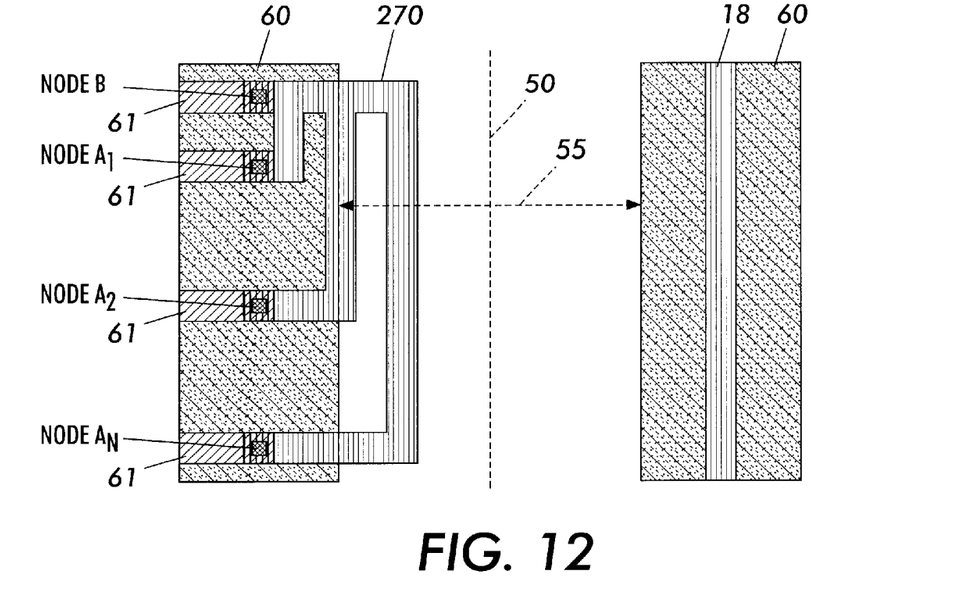
FIG. 12 is a plan view of a V-groove structure on a silicon wafer in accordance with a fifth embodiment of the present invention.

FIGS. 11 and 12 show the fourth and fifth embodiments. In one alternative embodiment, the gaurdring 18 may be eliminated. In both the fourth and fifth embodiments, the resistance layout on the left may be duplicated or mirrored on the right to eliminate the alignment effects as discussed with reference to the third and fourth embodiments. The principle of detection is the same. The resistor width of each of the resistor sections will be determined by the width of the V-groove 17. The major difference with these embodiments is that the resistors could be used in a "digital" manner. Depending on the width of the V-groove 17, a certain number of the resistor legs will be cut off, or open circuited. For example, in FIG. 11, resistor 200 is not affected. Resistor 210 looses some width because part of the resistance is etched away by the V-groove 17. However, this circuit does remain connected (not open circuited). Resistor 220 is completely cut off by the etched V-groove 17, and this creates an open circuit. Based upon the measured resistance value, the width of the V-groove 17 can be ascertained. A similar result is shown in FIG. 12 with respect to resistor 270. Therefore, if each of these resistors (fourth or fifth embodiments) is connected to the appropriate circuitry as shown in FIGS. 13–14 for example, the number of open circuits can be determined and this number will be proportional to the width of the V-groove 17.

Figure 13:
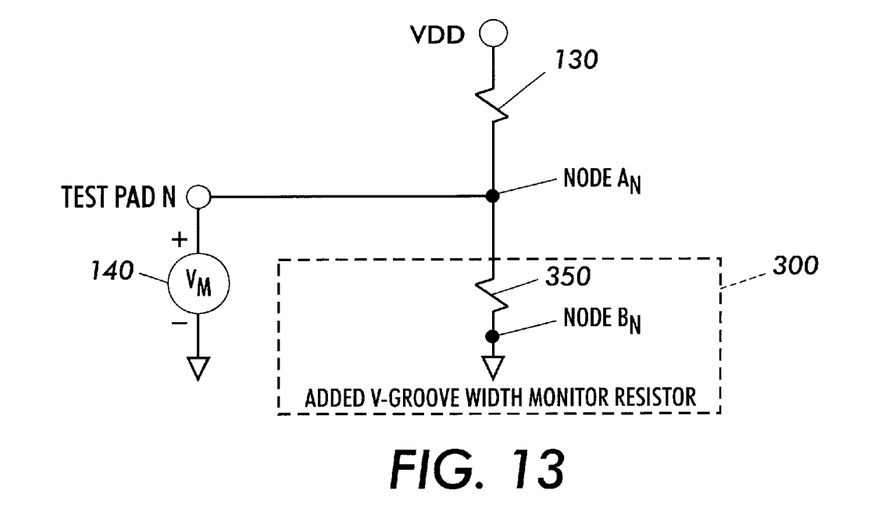
FIG. 13 is an electrical schematic in accordance with the fourth and fifth embodiments of the present invention.
Figure 14:
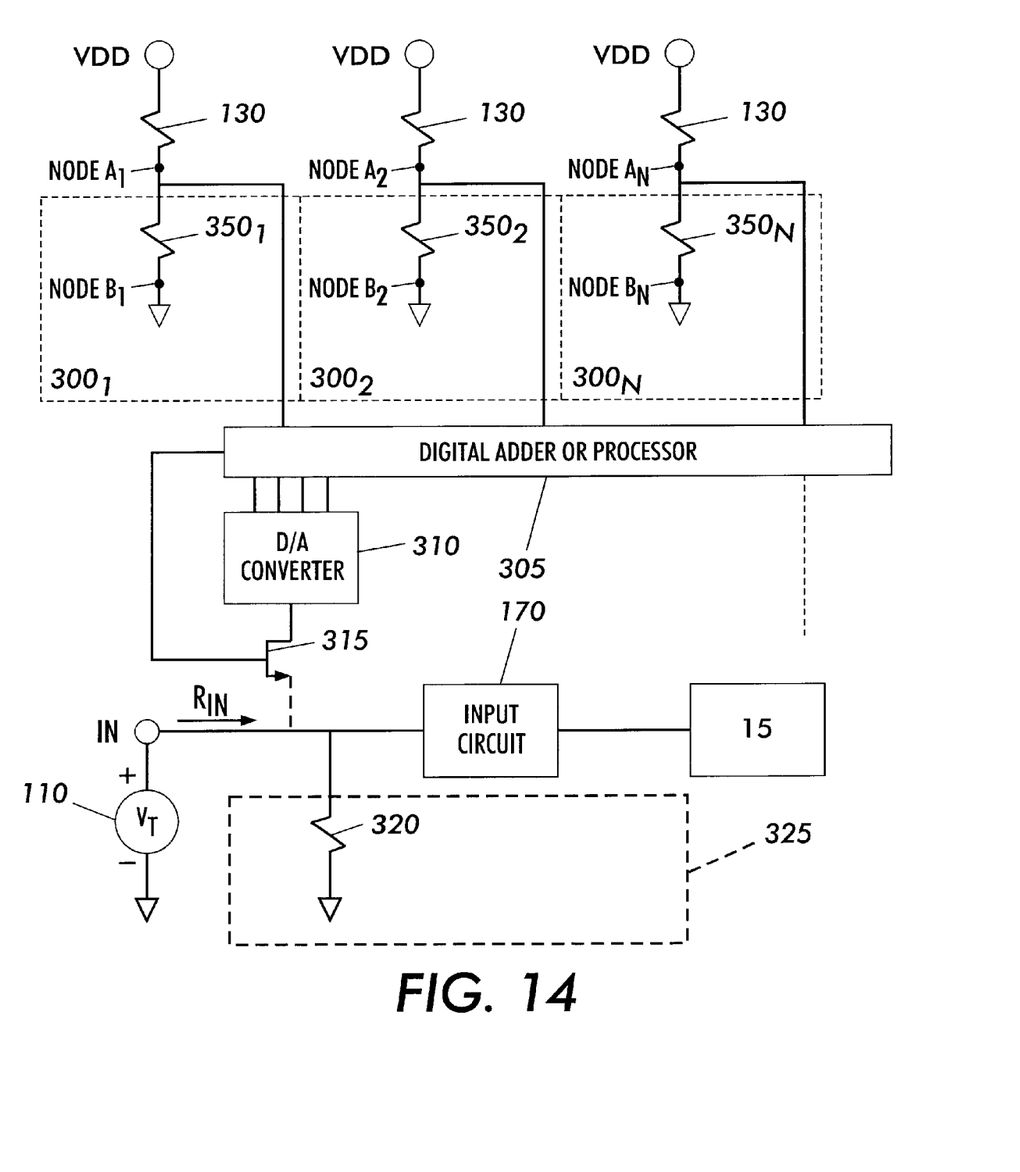
FIG. 14 is an electrical schematic in accordance with the fourth and fifth embodiments of the present invention.

FIGS. 13–14 show electrical schematics for testing resistance after the V-groove 17 has been etched onto the silicon wafer 11 for the fourth and fifth embodiments of the present invention. In FIG. 13, Node AN connects the test circuit to the added V-groove width monitor resistor(s) 58, which are connected to a reference voltage or ground by node $B_N$ as denoted by reference numeral 300. By adding a test pad 90 (input/output pad) and pull up resistor 130 to the silicon wafer 11, the voltage 140 across a resistor 350 can be measured by applying a known voltage VDD and measuring the voltage across the resistor 350 using a voltmeter 140 or other voltage measuring device. Applying the test circuit in FIG. 13 to the fourth embodiment, the resistor 350 denotes the resistance provided by resistors 200, 210, and 220 after etching the semiconductor wafer 11 in accordance with the fourth embodiment. Applying the test circuit in FIG. 13 to the fifth embodiment, the resistor 350 denotes the resistance of resistor 270 after etching the semiconductor wafer 11 in accordance with the fifth embodiment. Since the VDD voltage, pull up resistance and $V_M$ are known in either the fourth or fifth embodiment, the resistance value of resistor 350 can be calculated. Since voltage division results in $V_M = R350/(R350+R130)$, then $R58 = V_M \times R130/(1-V_M/VDD)$. Based on the resistance value and length of the resistor, the width of the resistor can be ascertained. Therefore, the V-groove width can be determined.

If R130 of FIGS. 13 and 14 is picked such that R130>>R350, the resistor divider circuits will provide a digital output, which indicates whether the resistor portion is completely etch away by V-groove or partially there. If R58 is open, or etch away, $V_M$="1", or be at the VDD level. If any of R58 is still present, $V_M$="0" or be close to ground and certainly below the logic threshold of VDD/2. his provides us with a digital result.

In FIG. 14, Nodes $A_1, A_2, \ldots A_N$ connects the test circuits $300_1, 300_2 \ldots 300_N$ to the added V-groove width monitor resistors $350_1, 350_2 \ldots 350_N$, which is connected to a reference voltage or ground by node $B_1, B_2, \ldots B_N$ as denoted by reference numeral 300. The advantage of this embodiment is that an additional test pad (input/output pad) does not need to be added to the chip 10 on the silicon wafer 11. Instead, one of the existing bonding pads 14 may be used.

The digital outputs, "0" or "1", on nodes $A_1-A_N$ are processed to produce a digital output or an analog output representing the width of the V-groove 17. For example if nodes Al-AN are added by digital adder or processor 305, the sum will be proportional to the width of the V-groove. This digital sum could be converted back to an analog level through a digital to analog converter 310, and multiplexed out to a new or existing pad using a transfer switch 315 for example. Input circuit 170 acts as a buffer between the active circuitry 15 and the test circuitry. Those skilled in the art of digital circuit design know how to add and process digital outputs.

While the invention has been described in detail with reference to specific and preferred embodiments involving the V-groove, it will be appreciated that various modifications and variations will be apparent to the artisan including the use of this width detection technique with trench, U-groove, or microelectromechanical systems (MEMS). All such modifications and embodiments as may occur to one skilled in the art are intended to be within the scope of the appended claims.

What is claimed is:

1. An apparatus for detecting width of a V-groove on a semiconductor wafer, comprising:
    a V-groove width monitor resistor overlapping a chip area and an area upon which the V-groove is to be etched;
    a pad etched on the silicon wafer and coupled to the V-groove width monitor resistor; and
    a tester supplying voltage to the pad after the V-groove has been etched into the silicon wafer; and
    means, coupled to the pad, for determining the width of the etched V-groove.

2. The apparatus as in claim 1, wherein the pad is an input/output pad.

3. The apparatus as in claim 1, wherein the pad is a separate test pad for testing V-groove width only.

4. The apparatus as in claim 1, further comprising a pull up resistance connected to the V-groove width monitor resistor and the pad.

* * * * *